United States Patent [19]
Berglund

[11] 3,970,878
[45] July 20, 1976

[54] PIEZOELECTRIC TRANSDUCER UNIT AND HYDROPHONE ASSEMBLY

[75] Inventor: Carl O. Berglund, Houston, Tex.
[73] Assignee: Teledyne Exploration Company, Houston, Tex.

[22] Filed: Mar. 31, 1975
[21] Appl. No.: 563,898

[52] U.S. Cl. .......... 310/8.6; 310/8.9; 310/9.1; 340/10
[51] Int. Cl.² .......... H01L 41/08
[58] Field of Search .......... 310/8.3–8.6, 310/8.9, 9.1, 9.4; 340/10

[56] References Cited

UNITED STATES PATENTS

| | | | |
|---|---|---|---|
| 3,187,300 | 1/1965 | Brate | 340/10 |
| 3,255,431 | 6/1966 | Howatt | 310/9.1 X |
| 3,390,286 | 6/1968 | Gradin et al. | 310/8.4 |
| 3,390,287 | 6/1968 | Sonderegger | 310/8.4 X |
| 3,437,171 | 4/1969 | Davis et al. | 340/10 X |
| 3,656,217 | 4/1972 | Scott, Jr. | 310/9.1 X |
| 3,660,809 | 5/1972 | Pearson | 340/10 X |
| 3,745,384 | 7/1973 | Blanchard | 310/8.5 X |
| 3,763,464 | 10/1973 | Laurent | 310/8.3 X |
| 3,827,023 | 7/1974 | Henriquez et al. | 340/10 X |
| 3,832,762 | 9/1974 | Johnson | 310/9.1 X |

*Primary Examiner*—Mark O. Budd
*Attorney, Agent, or Firm*—Dowell & Dowell

[57] ABSTRACT

A pressure-sensitive improved acceleration-cancelling hydrophone assembly and transducer unit for inclusion therein, each transducer unit being made of glass and metal parts hermetically sealed together with no exposed plastic, each sealed unit containing paired piezoelectric wafers mounted inside the sealed unit in opposed relationship and electrically interconnected such that pressure forces combine in the output signal but acceleration forces cancel, and the hydrophone assembly comprising a barrel in which one or more of these transducer units are mounted in vibration-isolated relationship, the mountings engaging the transducer units at surfaces thereof which are least likely to couple vibrations to the piezoelectric wafers.

12 Claims, 20 Drawing Figures

PIEZOELECTRIC TRANSDUCER UNIT AND HYDROPHONE ASSEMBLY

FIELD OF INVENTION

This invention relates to pressure-sensitive acceleration-cancelling piezoelectric transducer units for inclusion in improved hydrophone assemblies of the type towed in streamers behind marine survey vessels, and more particularly relates to improvements in the physical structure of the transducer units and the hydrophone assemblies mounting them.

BACKGROUND AND PRIOR ART

For the purpose of determining the formation of strata in formations beneath the bottom of the sea, it is the usual practice to tow oil-filled streamer cables behind survey ships carrying complex electronic equipment for recording signals picked up by the hydrophones mounted in the cables and responsive to acoustic pressure waves resulting from local artificially-generated seismic disturbances. The streamers are usually towed at depths ranging from about 20 feet up to about 80 feet, and these streamers are as long as 2½ miles and have hydrophones therein spaced several feet apart over that length.

Present day hydrophones perform satisfactorily and tend to remain in good condition for a while and until their utility is destroyed, usually either by salt-water contamination occurring when a streamer is cut open or broken allowing sea water to enter, or else by the transducer units being crushed by over-pressure when a streamer becomes accidentally severed from the towing vessel and sinks into deep water. Both of these occurrences are not at all unusual, it being estimated that damage of this sort occurs about once every 6 months to the average streamer in use requiring that it be rebuilt, often at great expense, since the hydrophone units must be individually repaired or replaced. Presently available hydrophones include transducer units in which the various parts are cemented together usually by epoxy plastics which, when exposed to sea water absorb salt. Piezoelectric units are inherently high-impedance devices, and only a small electrical leakage ruins their sensitivity. Boiling them in distilled water only partially restores their original characteristics, and of course, they must be completely disassembled from the streamer before this can be done. Mere flushing of the cable would be ineffective. On the other hand, over-pressure can either crush the transducer unit, or flex it to the point where the piezoelectric wafers are cracked and thereby rendered useless. Spacers are used in prior-art devices to limit the deformation of these units by bottoming against the spacers, and the present invention contemplates their use too, but solves most of the over-pressure problem by mounting the piezoelectric wafers inside strong metal shells in which they are then hermetically sealed.

Typical hydrophones of the prior art which make extensive use of plastic parts and component-to-component seals of epoxy include U.S. Pat. Nos. 3,187,300 to Brate and 3,832,762 to Johnson et al. These are not hermetically sealed transducer units within the meaning of the term as used in the present disclosure where only parts of metal and glass make up the outer surfaces of the transducer units. These parts not only can absorb no salt whatever, but salt-water rolls right off of the glass insulators which are fully cleaned by mere rinsing with distilled water. Another advantage of the metal-glass construction is that these materials are not degraded as time goes on, as is the case with plastic construction causing eventual loss of mechanical integrity by the hydrophone.

THE INVENTION

The present invention seeks to improve prior art hydrophones both by improving the transducer units per se and also by improving the manner in which transducer units are mounted to form a completed hydrophone assembly. The improvement in the transducer unit itself, which comprises two acceleration-cancelling piezoelectric wafers, is accomplished by providing a metal shell which may also include glass portions, these metal and glass portions being hermetically sealed together, for instance by soldering, so that the only members of the transducer unit which are exposed to the outside of the unit consist entirely of glass and metal, there being no epoxy or other plastic parts exposed to the outside of the transducer unit. Each of these shells includes paired oppositely-disposed end portions, that is, one or more such pairs being joined together by a central portion. The end portions, at least, are made out of a thin planar material such as metal or glass especially chosen for its high modulus of elasticity so that the end portions act as diaphragms which are flexed by changes in the instantaneous hydro-pressures to which they are exposed. It is an important feature of the present invention that the piezoelectric wafers are bonded to the inner surfaces of said planar end portions so that they are housed entirely within the hermetically sealed shell and therefore protected thereby. A spacer is inserted which extends nearly to both of the end portions in each pair and provides on each end a surface against which the piezoelectric wafers can bottom in the event of a very large over-pressure so as to limit the deformation of the end portions and of the piezoelectric wafers, thereby preventing flexing thereof to a degree sufficient to crack the piezoelectric wafers or to crush the metal shell. The sensitivity to pressures applied to the shell is concentrated for the most part at the opposed planar end portions thereof, so that the shells are relatively insensitive in their central portions. Flange means are fixed to the shell around the central portion and symmetrically located with respect to the end portions, and these flange means make the shell very rigid in that area. The flange means are used to mount the transducer unit within the barrel which forms the main body portion of the hydrophone assembly. Because of this type of mounting, and because of elastomeric cushions placed between the flange portions and the barrel of the hydrophone assembly, noises caused by flexing or scuffing of the streamer have minimal transfer in a way that might cause deformation of the end portions on which the piezoelectric wafers are mounted.

It is a principal object of the present invention to provide an acceleration-cancelling pressure-sensitive transducer unit for use in hydrophone, wherein the transducer unit is hermetically sealed and has outside surfaces consisting entirely of glass and metal with no plastic parts exposed. It is a corollary object of this invention to provide such a transducer unit in which the piezoelectric wafers are contained within the shell of the transducer unit and are fully protected thereby against crushing or fracture at pressures expected to be encountered, and against loss of sensitivity attributable to salt-water contamination. The integrity of the units within a streamer cable, according to the present invention, is primarily guaranteed by the manner in which the transducer unit is constructed so that no reliance must be placed upon the ability of the streamer to protect the hydrophone from such contamination.

It is another major object of this invention to provide a transducer unit having diaphragm-like opposed planar surfaces to which the piezoelectric wafers are bonded, the material of these diaphragm-like portions of the transducer being carefully selected to provide adequate protection against undue deformation due to outside pressures, while at the same time providing deformation characteristics which will faithfully follow the outside pressures so as to transfer flexing to the piezoelectric wafer bonded thereto. The material of the diaphragm-like end portions must have a very high modulus of elasticity, must be thick enough to protect the crystals bonded to its inner surface, but must be thin enough to be deformable by the pressures applied differentially against these surfaces. A transducer unit of this type must be responsive to micro-pressures creating micro-deformations and producing microvolt outputs in response thereto.

Still another important object of the present invention is to provide a transducer in which the frequency response of the unit, especially at seismic frequencies ranging from 1 or 2 Hertz to 100 Hertz is stable, and is relatively unchanged by exposures to over-pressure, by aging, or by changes in the depth at which the streamer cable is being towed within the range of usual towing depths from about 20 feet to 80 feet. One highly desirable characteristic of a hydrophone assembly is that its response should remain essentially linear for depths varying within this approximate range so that the transducer delivers equal amplitude output for equal pressure changes. In years past, the seismic signals delivered by these transducers to the data processing equipment aboard the towing vessel were viewed essentially as qualitative information. However, modern digital processing equipment is used to an increasing degree to be responsive also to actual amplitudes of the return signals to help detect more accurately changes in the interfaces occurring beneath the bottom of the sea. Amplitudes measured at different depths should remain essentially constant for a particular formation, instead of varying with the depth at which the streamer is towed and instead of varying with the age of the transducer unit and its exposure to salt from the sea water, the latter deficiency being very common in transducer units having exposed plastic parts, such as epoxy cements.

It is another important object of the present invention to provide a transducer unit having a minimum of plastic in its construction. This is desirable because of the fact that the use of a considerable amount of plastic introduces severe hysteresis into the characteristics of the response of the transducer unit. Plastics do not behave the same while they are being compressed as they behave when the compressive force is removed and they are allowed to expand again. The presence of plastics not only tends to reduce the sensitivity of a transducer unit to the extent that the plastics are somewhat compressible, depending partly upon their trapped air content, which compressibility tends to reduce the amount of strain actually transferred to the piezoelectric wafer, but they also introduce hysteresis into the motion transferred from outside the unit to the piezoelectric wafer. The introduction of hysteresis also introduces phase shift, and this phase shift makes the acceleration signal resulting from acceleration forces applied to one of the paired piezoelectric wafers become phase shifted in time with respect to the opposite signal which is induced by the same acceleration into the other piezoelectric wafer, whereby these signals cancel imperfectly, thereby reducing the acceleration-cancelling capability of a transducer unit containing plastic parts. In the transducer units as currently manufactured, the only cement appearing therein comprises an extremely thin conductive layer, about one thousandth of an inch thick, bonding the electrode on one side of each of the piezoelectric wafers to the inside surface of an end portion of the transducer unit. Such a thin conductive layer spread over a relatively large area does not significantly reduce the sensitivity of the transducer unit, and does not introduce noticeable phase shifts. Since the epoxy is located inside the hermetically sealed shell it is in no danger of salt water contamination.

Still another important object of the invention is to provide a transducer unit having adequate output amplitude, in the vicinity of 50 microvolts per microbar, and it is particularly important to provide transducer units having high capacitance. The importance of high capacitance is that it provides a transducer having high output power level, not just high output voltage. The high capacitance is also an advantage in that, the higher the capacitance, the lower the impedance of the unit and the less impedance reduction is necessary at the transformers which are used to join the hydrophones in the streamer with the electrical wiring going to the data processing equipment aboard the towing vessel.

Still another object of the invention is to provide a transducer unit in which, after the piezoelectric wafers have been mounted in the shell and the shell is hermetically sealed, the response characteristics of each of the individual piezoelectric wafers can be separately measured and checked within the sealed shell prior to connection of their individual output leads externally of the shell, thus making it possible to be sure that the transducer units are undamaged and that their characteristics are such as to permit cancellation of acceleration forces when paired.

It is another important object of the invention to provide transducer units which are easy to manufacture and which can be manufactured at low cost, cost being a particularly important factor in view of the tremendous number of hydrophones which are contained within each streamer cable.

Another major object of the invention is to provide a hydrophone assembly including a protective barrel portion and end discs forming a body for the purpose of housing and mounting one or more transducer units according to the invention. As stated above, the hermetically sealed shells of the transducer units have flange means on the outer surfaces of their central portions located away from the diaphragm-like flexure end portions of the transducer units, these flanges being relatively insensitive to vibrations. The present hydrophone assembly provides elastomeric pad means within the barrel, and these pads grip the flanges of the transducer units and resiliently support them in a manner providing minimal transfer of noise components directly from the barrel to the shells of the transducer units. In addition, rigid terminals are mounted on the body of the hydrophone assembly and all wiring going to the transducer units is made extremely flexible, thereby decoupling mechanical forces associated with signal wires which must be connected to the terminals on the assembly.

Other objects and advantages of the present invention will become apparent during the following discussion of the drawings, wherein:

THE DRAWINGS

Figure 1:
FIG. 1 is a perspective view of a piezoelectric wafer used in the present transducer.
Figure 2:
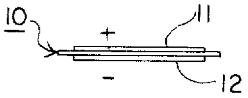
FIG. 2 is a side view of a wafer according to FIG. 1.
Figure 3:
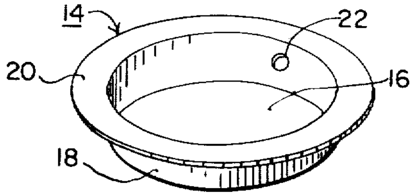
FIG. 3 is a perspective view showing a preferred embodiment of a shell member for a transducer according to the present invention.
Figure 4:
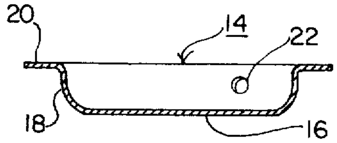
FIG. 4 is a sectional view of the shell member shown in FIG. 3.

Referring now to the drawings, FIGS. 1 and 2 show a view of a piezoelectric wafer having a ceramic crystal portion 10 and this crystal having metallized surfaces 11 and 12 on both sides, generally deposits of silver, serving as electrodes. FIG. 3 shows a cup-shaped shell member 14, of which two are used in the preferred embodiment, each shell member 14 having a planar end wall portion 16, an annular central wall portion 18 and a flange 20. A hole 22 is provided through the shell portion to receive an electrical terminal as described hereinafter with reference to FIG. 5. In the embodiment of the invention presently being manufactured, the shell portions 14 are made of half-hard beryllium copper alloy No. 25, the shell portion being stamped from a blank disc of the metal having a thickness of 0.012 inch. The end portion 16 is joined to the annular wall portion 18 at a rounded filet 17, and the annular portion 18 is similarly joined to the flange portion by another filet.

Figure 5:
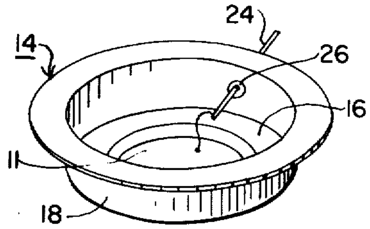
FIG. 5 is a perspective view of the shell member of FIG. 3 showing a wafer according to FIG. 1 bonded in the end portion of the shell and connected to a feed-through terminal.
Figure 6:
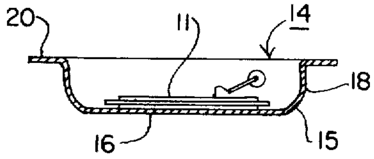
FIG. 6 is a sectional view of the shell member and piezoelectric wafer shown in FIG. 5.

As shown in FIG. 5, the shell portion 14 supports at its end wall 16 a piezoelectric wafer 10 as shown in FIG. 1, the wafers in all of the different shell units always being mounted so that their positive and negative poled electrodes 11 and 12 always face in the same directions. In the present illustration the negative electrode 12 is bonded to the end portion 16, although the positive electrode could as well be so connected. At any rate, the other electrode 11 which faces inwardly of the shell member is connected by a fine wire to a wire terminal 24 which passes through a glass bead 26, the glass bead being bonded in the hole 22 which goes through the sidewall 18 of the shell 14. In this manner, the shell itself becomes the negative terminal of the transducer unit and the positive terminal of each of the piezoelectric wafers is brought out of the shell on an hermetically sealed wire. As stated in the objects of the invention, it is an advantage to have each piezoelectric wafer individually testable before they are connected together so as to be sure that each piezoelectric wafer is operating properly and is undamaged by the process of mounting it in the shell.

Figure 7:
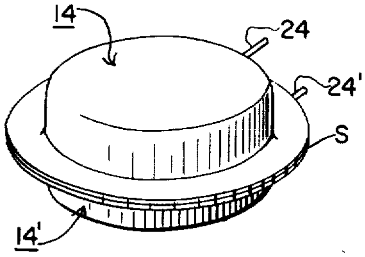
FIG. 7 is a perspective view of a transducer unit formed by two members as shown in FIG. 5 joined together and soldered at their flanges.
Figure 8:
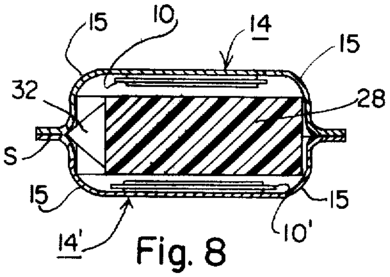
FIG. 8 is an axial section view taken through the transducer unit of FIG. 7.

The tested shells are then assembled in pairs as shown in FIGS. 7 and 8 to form a single transducer unit, including two cup-shaped members 14 and 14', their terminals 24 and 24' still remaining separate during soldering of the flanges and testing, and until they are actually wired together just prior to mounting of the transducer unit within the body of a hydrophone assembly as shown in FIGS. 16 through 20.

FIG. 8 shows an axial cross-section taken through a transducer unit as shown in FIG. 7 including the piezoelectric wafers 10 and 10' mounted within the cup-like shells 14 and 14' which are then soldered together at their flanges in the location of the reference numeral S. This of course forms an hermetic seal. Before sealing, however, a plastic spacer 28 is inserted in the cups, the plastic spacer having three slots 29, 30 and 31 into which three teflon triangles 32 are inserted to keep the plastic spacer 28 from rattling around inside the shell comprising the cup members 14 and 14'. The slot 34 is provided in the spacer 28 to clear the inner ends of the terminal wires 24 where they connect to the piezoelectric wafers. The use of a spacer of this general type is well known in the prior art and provides within the shell two opposed flat surfaces such as the surface 36 against which the inner surfaces of the piezoelectric wafers 10 can bottom when the cup is being compressed by a very large over-pressure greatly exceeding normal pressures encountered during operation, this expedient serving to prevent actual crushing of the cup with the attendant fracturing of the crystal element 10 which is quite fragile. The spacer does not normally contact the piezoelectric wafer but is spaced from it, because the spacer lies against the filets 15 where the annular walls 18 join the end portions 16 of each cup 14. In the absence of a spacer 28, the cup would not have to be crushed in order to break the crystal element, it need only be overstressed slightly beyond the capability of the crystal element 10 to bend.

Figure 11:
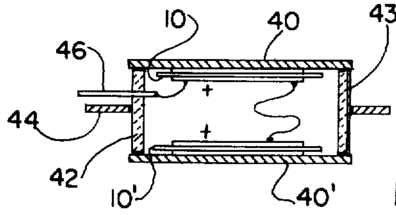
FIG. 11 shows a modified form of transducer having a glass central portion.
Figure 10:
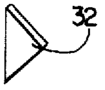
FIG. 10 is a perspective view of a teflon triangular pad, of which three are used in the spacer shown in FIG. 9 to provide centering and to prevent its rattling around within the transducer unit.
Figure 9:
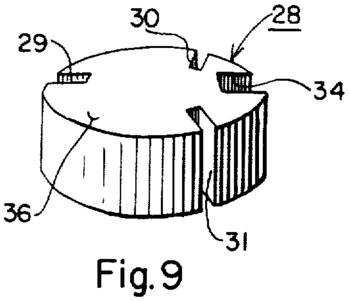
FIG. 9 is a perspective view of a plastic spacer inserted within the transducer as shown in FIGS. 7 and 8 to prevent collapse thereof.

Referring not to FIG. 11, this figure shows a modified transducer unit in which piezoelectric wafers of the type shown in FIG. 1 and represented generally by the reference characters 10 and 10' are bonded to two flat discs 40 and 40' which can be made of the same spring-like metal as the cup members 14, but which are not stamped into the form of cups. These discs 40 are bonded to a glass body 42 which is of cylindrical shape and includes a metal flange ring 44 surrounding the body and symmetrically located with respect to the two discs 40. The flange ring 44 is soldered to the outer periphery of the cylindrical glass member 42 and the discs 40 are soldered around their peripheries to the glass cylinder at its ends. The discs 40 form flexible diaphragm-like end portions for the shell of the transducer unit and the negative electrodes 12 of the piezoelectric wafers are bonded to the discs 40, for instance, by an extremely thin layer of a conductive epoxy or other cement. The discs 40 and 40' can be conductively connected to the flange ring 44 by suitable metallizing on the outer surface of part of the cylindrical member 42, as shown at 43. Suitable terminals 46 extend through the glass cylinder and are bonded thereto so that the entire unit forms an hermetic seal. The terminal 46 can be connected to the positive electrode of the piezoelectric wafer, and then its positive electrode can be connected by a longer wire 47 to the positive electrode of the other wafer 10'. There is no reason why the positive electrodes need face inwardly, just so the same polarity of the electrode faces inwardly on both piezoelectric wafers in the same transducer unit.

Figure 12:
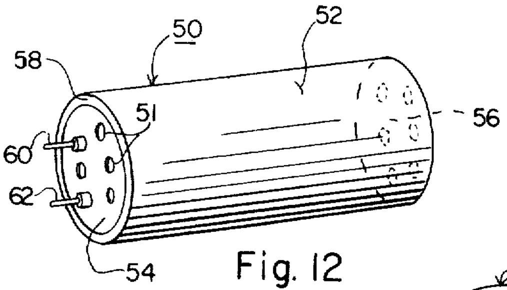
FIG. 12 is a perspective view of a hydrophone assembly according to the present invention.

FIG. 12 shows a completed hydrophone assembly 50 comprising a barrel portion 52 and two end disc portions 54 and 56 each of which is perforated as at 51 so as to allow flow-through of the fluid within the streamer cable, usually oil. The ends of the barrel portion are spun over as shown at 58, and these ends hold the end discs 54 and 56 in place. The hydrophone assembly is also provided with two electrical connection terminals 60 and 62, one of which is connected to the outer shell of each of the transducer units and the other of which is connected in parallel to all of the terminals 63 extending from the various transducer units, FIG. 15. The present disclosure recognizes that there may be occasions when it is desirable to place different transducer units in series rather than in parallel, but it is the general practice to wire these units in parallel in order to lower the impedance of their composite circuitry.

Figure 14:
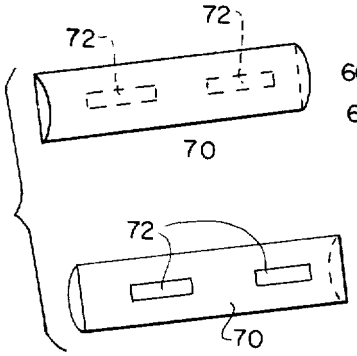
FIG. 14 is a perspective view of typical elastomeric pad members for insertion within the transducer body FIG. 12 to support therewithin two transducer units of the type shown in FIG. 13.
Figure 13:
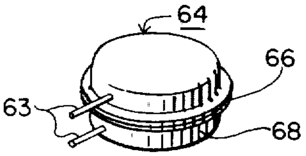
FIG. 13 is a perspective view of a transducer unit of the type mounted within the hydrophone assembly.
Figure 15:
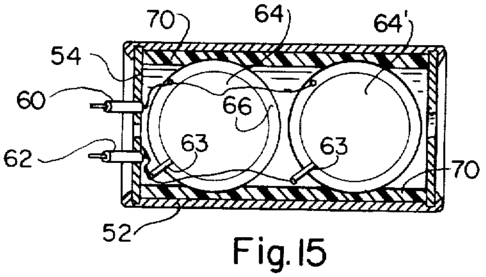
FIG. 15 is a longitudinal section view taken through a hydrophone assembly having two transducer units mounted transversely therein.

The transducer unit 64 as shown in FIG. 13 is similar to that shown in FIG. 7, although it could also be of the type shown in FIG. 11 or any other type falling within the coverage of the present claims. At any rate, it has a flange 66 surrounding the cylindrical portion 68 of the transducer body, and this flange is used to mount the transducer 64 in grooves, such as the grooves 72 in the elastomeric pad means 70 as shown in FIG. 50, made for example of polyurethane. The groove 72 in FIG. 14 are disposed parallel to the axis of the barrel portion 52 of the hydrophone assembly, and therefore using these pads, one would mount two transducers facing transversely of the hydrophone assembly in the manner shown in FIG. 15 in which the transducers 64 and 64' are held in place by two elastomeric pads 70 of the type shown in FIG. 14. FIG. 15 also includes a showing of the electrical terminals 60 and 62 extending from the end disc 54, and it will be seen that the terminal 60 is connected to a wire which is soldered to the flange portion 66 of each of the transducers. The terminal 62 on the other hand is connected to a wire which couples together the terminals 63 corresponding with the terminals 24 shown in FIG. 5, which terminals are connected to the piezoelectric wafers inside of the transducer units.

Figure 16:
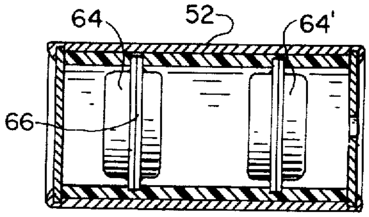
FIG. 16 is a longitudinal section view through a hydrophone assembly according to the invention having two transducer units mounted axially therein.

FIG. 16 is similar to FIG. 15 except that the transducer units 64 and 64' are rotated so that they face axially of the hydrophone barrel 52, and the grooves 72 are rotated in the elastomeric pads 70 so as to accept the flanges 66 of the transducer units and hold them in place.

Figure 17:
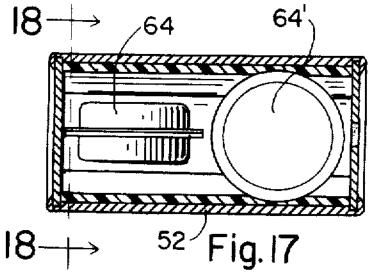
FIG. 17 is a longitudinal section view taken through a hydrophone assembly showing both transducers mounted transversely thereof, but rotated 90° with respect to each other.
Figure 18:
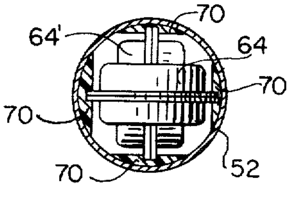
FIG. 18 is a cross-section view of the transducer shown in FIG. 17 taken along lines 18—18.

FIG. 17 is similar to FIG. 15 except that it employs two transducer means 64 and 64' which both face transversely of the hydrophone assembly, but are rotated 90° with respect to each other. As shown in FIG. 18 this assembly requires four elastomeric pad means 70, instead of two, since the flange of the two transducer means do not line up with each other.

Figure 19:
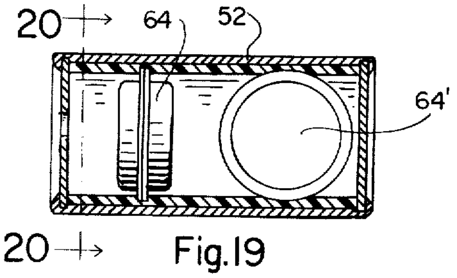
FIG. 19 is a longitudinal section view through a hydrophone assembly showing one transducer mounted longitudinally and the other transducer mounted transversely.
Figure 20:
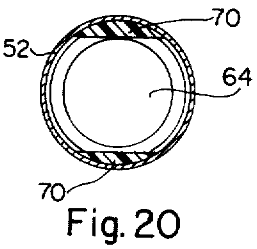
FIG. 20 shows a cross-sectional view taken along lines 20—20 of FIG. 19.

FIG. 19 and FIG. 20 show still another modification of a hydrophone assembly in which the two transducers 64 and 64' are disposed, one facing axially of the unit and the other facing transversely of the unit. In this version, as shown in FIG. 20 only two elastomeric pad means 70 are required to hold the transducers in place.

With regard to the four different mounting orientations of the transducer means as shown in FIGS. 15 through 19, these different orientations provide somewhat different responsiveness to noise coming from different directions. The difference in response to noise in a streamer cable application of these acoustic transducers is not believed to be very great as between the four different mounting orientations because the transducer means themselves when mounted by supporting their flanges are relatively insensitive to accelerations and other noise transmitted from the barrel 52. Moreover, it is believed that there would be no difference in desired signal sensitivity of these hydrophone units because pressure variation is applied equally from all directions due to acoustic stimuli, and therefore, it does not matter in which direction the transducer means are faced. However it is important that the wiring within the hydrophone assembly be placed so that it does not brush against the diaphragm-like end faces of the transducer units which are extremely sensitive to any contact therewith.

The selection of the materials of which the shell portions are made, and particularly the end portions thereof, must be chosen with great care in order to provide adequate strength to prevent crushing during normal use and even during substantial over-pressures, while at the same time providing a sufficiently high modulus of elasticity so that the flexing of the end portions will be substantially linear with pressure change and will exhibit minimum hysteresis whereby both the frequency and amplitude response of the transducer unit will tend to remain constant. For this purpose, the applicant has found half-hard beryllium copper alloy No. 25 to be quite satisfactory, although other materials can be used to provide a similar performance, these materials including glass, stainless steel, and phosphor bronze.

This invention is not to be limited to the exact forms shown in the drawings, for obviously changes can be made therein within the scope of the following claims:

I claim:

1. A pressure-sensitive acceleration-cancelling piezoelectric transducer unit for use in a hydrophone assembly, comprising:
   a. an hermetically sealed hollow shell member having a central portion and having paired mutually-parallel opposed planar end portions joined to and spaced apart by the central portion, the material in the end portions having a high modulus of elasticity and being thin so that the end portions operate as diaphragms deformable inwardly of the shell member by hydro-pressure applied thereto;
   b. a piezoelectric wafer attached to the interior surface of each end portion, each wafer comprising a crystal sheet metallized on its opposed surfaces to provide electrodes of opposite polarity, the wafers of opposed end portions being conductively attached to the end portions such that the electrodes of paired wafers having one polarity are attached to the end portions and the electrodes of the opposite polarity face inwardly of the shell member;
   c. electrical terminal means each including an insulator member and a conductor member passing through the central portion of the shell member and hermetically sealed thereto, the terminal means being connected inside the shell member with said electrodes of the opposite polarity;
   d. means on the outside of the central portion of the shell member for mounting the transducer means in a hydrophone array; and
   e. said shell and terminal members being the only parts exposed outside of the transducer unit and consisting entirely of glass and metal hermetically sealed together.

2. The transducer unit as set forth in claim 1, wherein said electrical terminal insulator members comprise glass insulator bead means bonded in said central portion and having wire passing therethrough.

3. The transducer unit as set forth in claim 1 wherein the high-modulus portions of said shell member comprise materials taken from the group including beryllium copper, stainless steel, glass and phosphor bronze.

4. The transducer unit as set forth in claim 1, wherein the planar end portions of said shell member comprise half-hard beryllium copper alloy No. 25 0.010 inch thick.

5. The transducer unit as set forth in claim 1, wherein the central portion is made of glass and the end portions are made of thin metal.

6. The transducer unit as set forth in claim 1, wherein said mounting means comprises flange means fixed to the central portion symmetrically with respect to the paired end portions and extending outwardly from the central portion.

7. A pressure-sensitive acceleration-cancelling piezoelectric transducer unit for use in a hydrophone assembly, comprising:
   a. an hermetically sealed hollow shell comprising two cups each having an end portion and having an annular wall extending around the end portion at one end of the wall and terminating at the other end of the wall in a radially disposed flange extending outwardly from the annular wall substantially parallel to the end portion, the cups having their flanges abutting and hermetically sealed together to form said sealed shell, the material of the cups having a high modulus of elasticity and said end portions being thin so that the end portions operate as diaphragms deformable inwardly of the shell by hydro-pressure applied thereto;
   b. a piezoelectric wafer attached to the interior surface of each end portion, each wafer comprising a crystal sheet metal coated on its opposed surfaces to provide electrode means of opposite polarity, the wafers being attached to the end portions with their electrode means of one polarity conductively attached to the end portions and with their electrode means of the opposite polarity facing inwardly of the shell;
   c. electrical terminal means adjacent said flanges and passing through the annular wall of the shell in insulated relationship and hermetically sealed thereto, the terminal means being connected inside the shell with said electrode means of opposite polarity; and
   d. the shell and terminal means being the only parts exposed outside of the transducer unit and consisting entirely of glass and metal hermetically sealed together.

8. The transducer unit as set forth in claim 7, wherein said electrical terminal means comprises in each cup a wire terminal extending through a glass bead, said bead passing through a hole in the wall of the cup between said end portion and said flange and being bonded to the wall to effect an hermetic seal, and each wire terminal being connected inside the cup exclusively with the electrode means of opposite polarity of the wafer which is attached to the adjacent end portion of the corresponding cup.

9. The transducer unit as set forth in claim 7, wherein the cups are made of a material taken from the group including beryllium copper, stainless steel, glass, and phosphor bronze.

10. The transducer unit as set forth in claim 7, wherein in the planar end portions comprise beryllium copper alloy No. 25 0.010 inch thick.

11. The transducer unit as set forth in claim 7, wherein said flanges are located in the walls of the shell symmetrically with respect to the end portions of the shell and comprise mounting means for the transducer unit.

12. A hydrophone assembly, comprising:
   a. one or more transducer units each comprising a shell consisting of two similar cup-shaped halves each having an annular central portion attached at one end to an end portion, and attached at the other end to an outwardly extending flange, said flanges being abutted and hermetically sealed together and surrounding the central portion of the shell and located symmetrically with respect to said end portions, pressure-sensitive means mounted inside the shell to said end portions, and glass insulated feed-through terminals hermetically sealed in said central portion and connected inside said shell to said pressure sensitive means;
   b. a hydrophone body comprising a substantially rigid barrel of diameter larger than said flange means; and
   c. elastomeric pad means disposed inside said barrel and wedged between said flange means and said sleeve and maintaining each transducer unit mounted to the body at its flange means, the central end portions of the transducer units being exposed and free of contact with other parts of the assembly and consisting entirely of glass and metal.

* * * * *